United States Patent

Fukushima

[11] Patent Number: 5,544,189
[45] Date of Patent: Aug. 6, 1996

[54] SEMICONDUCTOR LASER DEVICE

[75] Inventor: Toru Fukushima, Tokyo, Japan

[73] Assignee: The Furukawa Electric Co., Ltd., Tokyo, Japan

[21] Appl. No.: 157,099

[22] PCT Filed: Mar. 31, 1993

[86] PCT No.: PCT/JP93/00405

§ 371 Date: May 6, 1994

§ 102(e) Date: May 6, 1994

[87] PCT Pub. No.: WO93/20604

PCT Pub. Date: Oct. 14, 1993

[30] Foreign Application Priority Data

Mar. 31, 1992 [JP] Japan .................................. 4-105388

[51] Int. Cl.⁶ ..................................................... H01S 3/18
[52] U.S. Cl. .................. 372/46; 372/47; 372/96
[58] Field of Search ................................ 372/45, 46, 92, 372/96, 43, 47

[56] References Cited

U.S. PATENT DOCUMENTS

| 4,166,278 | 8/1979 | Suzaki et al. | 372/47 |
| 4,901,327 | 2/1990 | Bradley | 372/45 |
| 5,343,487 | 8/1994 | Scott et al. | 372/46 |

FOREIGN PATENT DOCUMENTS

| 63-52494A | 3/1988 | Japan . |
| 2-174286A | 7/1990 | Japan . |
| 2-201990A | 8/1990 | Japan . |

Primary Examiner—Rodney B. Bovernick
Assistant Examiner—Robert McNutt
Attorney, Agent, or Firm—Jacobson, Price, Holman & Stern

[57] ABSTRACT

There is provided a semiconductor laser device comprising a lower optical confinement layer 31, an active layer 3 and an upper optical confinement layer 34, said active layer 3 being inserted between said upper and lower optical confinement layers 31 and 34, characterized in that an electron injection path (along an n-type electrode 10→the upper optical confinement layer 34→the active layer 3) for injecting electrons into the active layer 3 by way of the optical confinement layers and a hole injection path (along p-type electrodes 6→the p-type InP layer 5→the active layer 3) for injecting holes into the active layer 3 without passing through the optical confinement layers are formed therein. With such an arrangement, electrons are injected into the active layer by way of the optical confinement layers, whereas holes are injected into the active layer without passing through the optical confinement layers. Therefore, the device shows a remarkable improvement in the modulation response and modulation bandwidth.

10 Claims, 3 Drawing Sheets

OPTICAL OUTPUT

SEMICONDUCTOR LASER DEVICE

BACKGROUND OF THE INVENTION

1. Field of Invention

This invention relates to a semiconductor laser device to be suitably used as transmission light source in the field of optical telecommunications and optical instrumentation.

2. Prior Art

Data transmission systems having a transmission rate of 10 Gb/sec. or so have been proposed for large capacity trunk lines of the coming generation in the field of optical telecommunications. In this connection, efforts have been paid to exploit the potential of soliton transmission as it serves for optical data transmission without affecting the dispersion characteristics of the optical fibers involved.

Semiconductor laser devices to be used for soliton transmission are required to show a high speed modulation capability for frequencies of 20 GHz and above in order to generate ultrashort pulses of light with a pulse width not greater than $1 \times 10^{-12}$ sec. (1 pico-sec.).

Paper 1 listed below discusses some of the results of theoretical researches made on the properties of semiconductor laser devices concerning light wave modulation, using rate equations [1a] and [1b] below for photon density S and carrier density N in an active layer.

Paper 1: IEEE J. Quantum Electronics, Vol. QU-22, p. 833–844, 1086.

$$dS/dt = \Gamma G(S,N) - S/\tau_p \quad [1a]$$

and $$dN/dt = J(t) - N/\tau_n - G(S,N) \quad [1b]$$

where, $\tau_p$: the photon lifetime in a laser cavity, $\tau_n$: the damping time constant of the carrier, G(S, N): the laser gain, J(t): the density of injected carriers including the modulation component and $\Gamma$: optical confinement factor.

The modulation response of a semiconductor laser device can be determined by solving rate equations [1a] and [1b] and its highest modulable cutoff frequency is obtained by using equation [2] below.

$$f_m = 2\pi 2^{1/2}/K \quad [2]$$

where, K is expressed by equation [3] below.

$$K = 4\pi^2(\tau_p + \epsilon/g_o) \quad [3]$$

where $g_o$ and $\epsilon$ respectively represent the linear differential gain and the saturation constant of gain G(S, N) above when it is expressed in terms of threshold carrier density $N_t$ as shown by equation [4] below.

$$G(S,N) = [g_o S/(1+\epsilon S)](N-N_t) \quad [4]$$

By studying the above equations, it is evident that the value of K needs to be reduced in order to expand the modulation bandwidth of a semiconductor laser device by increasing frequency fm of the semiconductor laser device and, by turn, it is necessary to reduce p, increase $g_o$ or reduce $\epsilon$ in order to reduce K.

Known techniques for reducing $\tau_p$ include reducing the length of the cavity and/or the reflectivity of the facet of the semiconductor laser cavity, whereas it is known that $g_o$ can be increased by doping the active layer to turn it into a p-type layer.

However, the values of $g_o$ and $\epsilon$ are invariable and $\tau_p$ can easily encounter a lower limit because it is correlated with the threshold current density when the semiconductor laser device is prepared by using a single and same semiconductor material such as GaInAsP. Thus, the above identified techniques are not feasible to reduce the value of K for such a semiconductor laser device.

A promising technique is the use of a multiple or single quantum well structure for the active layer in order to multiply the currently available value of $g_o$ by two to three times.

On the other hand, it, is pointed out in Paper 2 below that a quantum well structure can degrade the modulation response of a semiconductor laser device and therefore the time required for carriers to be injected into a quantum well structure is inevitably prolonged because of the specific properties of the quantum well structure.

Paper 2: 17th European Conference on Optical Communication, paper Tu. A4.3, Paris, France, September 1991.

Now, some of the problems pointed out in Paper 2 above will be summarized below.

The rate equations for a semiconductor laser device having a quantum well structure can be obtained by modifying equations [1a] and [1b] as shown below.

$$dS/dt = \Gamma G(S,N_w) - S/\tau_p \quad [5a],$$

$$dN_b/dt = J_b(t) - N_b/n - N_b/\tau_r + N_w/\tau_e(V_w/V_b) \quad [5b]$$

and $$dN_w/dt = J_w(t) - N_w/\tau_e + N_b/\tau_r(V_b/V_w) - G(S,N_w) \quad [5c]$$

where, $N_w$: the density of carriers in the quantum well layer, $N_b$: the density of carriers in the barrier layer, $V_w$: the volume of the quantum well layer, $V_b$: the volume of the barrier layer, $J_w(t)$: the density of carriers directly injected into the quantum well layer, $J_b(t)$: the density of carriers injected into the barrier layer, $\tau_r$: the time required for carriers in the barrier layer to be captured by the quantum well layer (which depends on the time required for carriers to run through the barrier layer or the optical confinement layer) and $\tau_e$: the elapsed time (extent) for carriers to be thermally emitted from the quantum well layer, so-called thermionic emission.

A conventional semiconductor laser device having a multiple quantum well structure modifies the density of carriers $\Delta J_b$ injected into the barrier layer by reducing the density of carriers injected into the quantum well layer $\Delta J_w$ to zero but the modulation response of a semiconductor laser device, or the response of photon density S to $\Delta J_b$, obtained by using such a modulation technique of modulating the carrier density is not desirable because of the reasons as described below by referring to equations [5a], [5b] and [5c].

Firstly, there occurs deterioration in the cutoff frequency as the value of $\tau_r$ increases because the modulation response of the photon density S to the carrier density $\Delta J_b$ is directly proportional to $(1+jWr)$, where $Wr=\tau_r^{-1}$.

Secondly, the square of the relaxation frequency is inversely proportional to the emission parameter of carriers ($\alpha$) as defined by equation [6] below.

$$\alpha = 1 + (\tau_r/\tau_e) \qquad [6]$$

Thirdly, an increase in the value of $\tau_r$ and decrease in the value of $\tau_e$ may often be observed, when the optical confinement layer and the quantum well layer are respectively made to be greater than 1,000 Å and smaller than 50 Å in an attempt to achieve a high output level of the device.

When $\tau_r$ increases while $\tau_e$ decreases, the cutoff frequency of a semiconductor laser device is lowered because of the increase in the value of $\alpha$ attributable to the increased $\tau_r$ and decreased $\tau_e$ values.

Thus, the modulation speed of a conventional quantum well type semiconductor laser device is limited by the slow response of carriers to obstruct any quick modulation of injection current.

This is a problem that surface-emission type semiconductor laser devices commonly experience when they are used for optical interconnection or parallel transmission.

Some of the problems of surface-emission type semiconductor laser devices are pointed out in Papers 3 and 4 below.

Firstly, while the film thickness controllability of a semiconductor multilayer film can be improved depending on temporary film formation in a same grown junction device, there occurs a phenomenon that the resistance of the semiconductor multilayer film becomes high on the p-electrode side. This phenomenon can be observed particularly in InP type multilayer films.

Secondly, a high-speed modulation becomes impossible when a pn junction type current blocking layer is used in the formation of a cavity for a buried structure because of a large parasitic capacity generated there.

Thirdly, if a device is made capable of high-speed modulation, the modulation response of the device can easily be degraded because of a poor thermal dispersion capability of its mesa-type active layer and a large current loss and an increased threshold current level can appear, because the current in the active layer becomes concentrated on the p-electrode side to reduce the current density at the center of the layer and therefore the overlapping area of the injected current and the photoelectric field.

Paper 3: 48th Device Research Conference., 5A-31, June, 1990.

Paper 4: IEEE J. Quantum Electron., QE-24, No. 9, pp. 1845–1855, September 1986.

Paper 5: 48th Device Research Conference., Post Deadline Paper 5B-2, June, 1990.

Paper 6: 49th Device Research Conference., Post Deadline Paper 3A-8, June, 1990.

SUMMARY OF THE INVENTION

In view of the above identified technological problems, it is therefore an object of the present invention to provide a semiconductor laser device having a high-speed modulation capability.

According to the invention, the above object is achieved by providing a semiconductor laser device comprising a lower optical confinement layer, an active layer and an upper optical confinement layer of said active layer being inserted between said upper and lower optical confinement layers, characterized in that an electron injection path for injecting electrons into the active layer by way of the optical confinement layers and a hole injection path for injecting holes into the active layer without passing through the optical confinement layers are formed therein.

When a semiconductor laser device according to the invention is of a quantum well type, the lower optical confinement layer, the active layer and the upper optical confinement layer may preferably be formed into a mesa section having an upper side covered by a p-type layer and lateral sides covered by an n-type layer.

When a semiconductor laser device according to the present invention has an above described configuration, the active layer and the barrier layer may be preferably made of a quantum well layer, whereas the lower and upper optical confinement layers may be preferably made of a single semiconductor layer.

Such a quantum well type semiconductor laser device may preferably have an n-electrode arranged on the p-type layer covering the upper side of the mesa section and p-electrodes arranged on the respective lateral sides of the mesa section, as it comprises as basic components an electron injection path for injecting electrons into the active layer by way of the optical confinement layers and a hole injection path for injecting holes into the active layer without passing through the optical confinement layers.

Since a quantum well type semiconductor laser device according to the invention, unlike a comparable conventional device, directly modifies the carrier density in the active layer (quantum well layer), or $J_b$, by establishing a relationship of $J_b=0$, the modulation response of the laser device (the response of the photon density S to $\Delta J_w$) will be theoretically improved in a following manner.

Firstly, the modulation characteristics of such a device show a remarkable improvement as compared with those of a conventional device because of nonexistence of a roll off term of the first degree, or $(1+jWr)^{-1}$.

Secondly, the modulation characteristics of such a device are also remarkably improved because the relaxation frequency increases by decreasing a close to one to allow a wide quantum well layer and narrow optical confinement layers.

The modulation responses of such a quantum well type semiconductor laser device will be further improved if electrons are injected into the quantum well layer by way of the optical confinement layers and the barrier layer and holes are injected directly into the quantum well layer without passing through the optical confinement layers and the barrier layer because the carrier density in the quantum well layer is directly modulated.

If a semiconductor laser device according to the invention is of a surface emission type, the active layer formed on the lower optical confinement layer may preferably take a mesa shape and the upper side of the mesa section may be covered by a p-type layer and the upper optical confinement layer located thereabove, while the lateral sides of the mesa section may be covered by an n-type layer.

When a semiconductor laser device according to the invention is configured in an above described manner, the lower and upper optical confinement layers may be made of a semi-insulating multilayer film.

Such a surface emission type semiconductor laser device may preferably have an n-electrode arranged on the p-type layer covering the upper side of the mesa section and p-electrodes arranged on the respective lateral sides of the mesa section, as it comprises as basic components an electron injection path for injecting electrons into the active layer by way of the optical confinement layers and a hole injection path for injecting holes into the active layer without passing through the optical confinement layers.

With such a surface-emission type semiconductor laser device, when less mobile holes are injected into the active layer without passing through the highly resistive optical confinement layers, there will be no stray capacitance such as pn junction and therefore a high-speed response will be realized, because the current injection into the active layer is carried out evenly to reduce the DC resistance of the device and, at the same time, the n-electrode and the p-electrodes arranged at the above described respective positions on the substrate are not oppositely located.

THE BEST MODES FOR CARRYING OUT THE INVENTION

Figure 1:
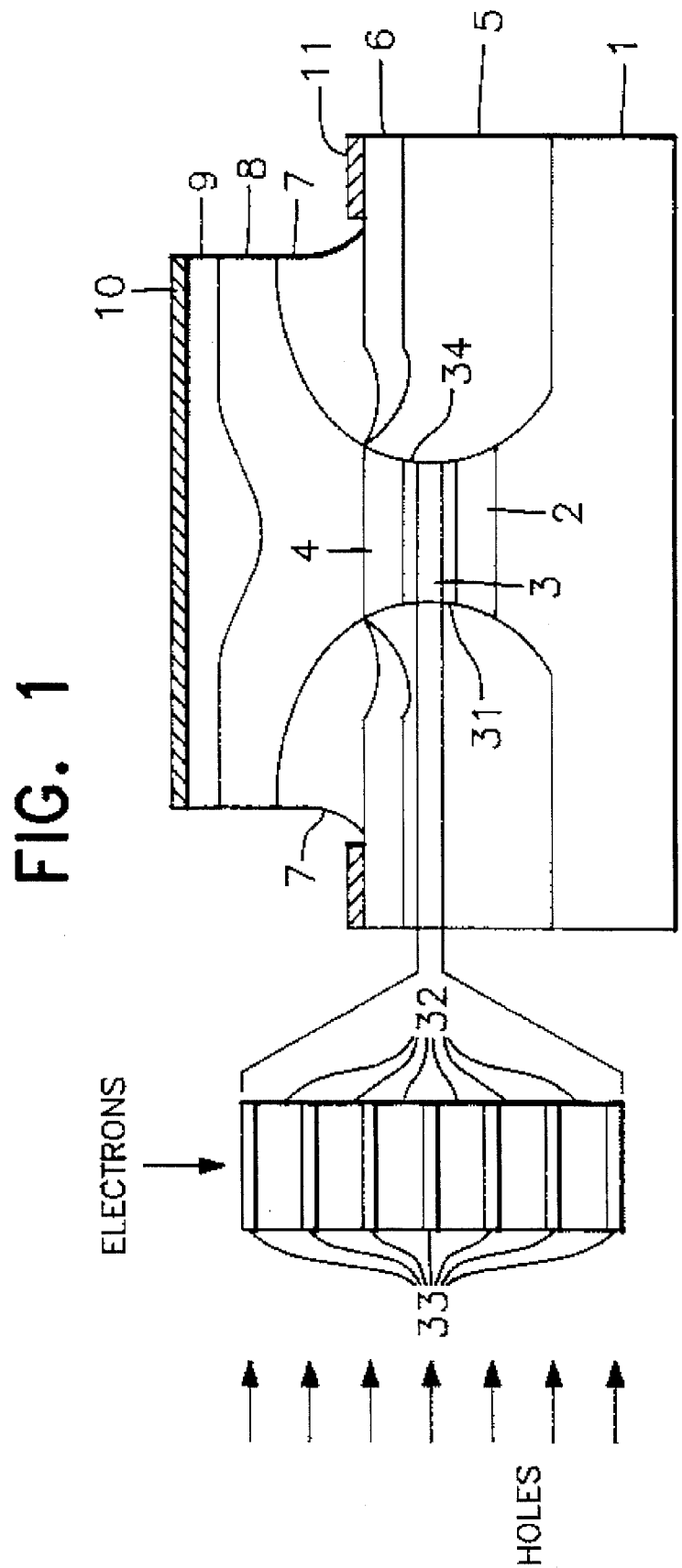
FIG. 1 is a schematic sectional view of a first embodiment of semiconductor laser device of the invention, which is a quantum well type semiconductor laser device.

FIG. 1 schematically illustrates a first embodiment of semiconductor laser device according to the invention, which is a quantum well type semiconductor laser device.

Such a quantum well type semiconductor laser device may typically be prepared in a following manner.

To begin with, a 1,000 Å thick nondoped InP layer 2, a 300 Å thick InGaAsP lower optical confinement layer 31 having a band gap wavelength $\lambda_g=1.1$ μm, a 900 Å thick active layer 3 including a multiple quantum well layer, a 300 Å thick InGaAsP upper optical confinement layer 34 having a band gap wavelength $\lambda_g=1.1$ μm, a 1,000 Å thick nondoped InP layer 4 are sequentially formed on a semiconductor InP semi-insulating substrate 1 in a first metalorganic chemical vapor deposition (MOCVD) process.

The above active layer 3 is in fact a multilayer structure formed by alternately arranged six 100 Å thick InGaAsP barrier layers with a band gap wavelength $\lambda_g=1.1$ μm and seven 50 Å thick InGaAsP optical confinement layers 33 with a band gap wavelength $\lambda_g=1.1$ μm.

Then, an $SiO_2$ film is formed on the nondoped InP layer 4 by means of a plasma CVD technique and processed to produce a stripe-shaped stop-etching mask by photolithography.

Thereafter, the areas not covered by the mask or the lateral sides of the layers from the nondoped InP layer 4 down to the InP semi-insulating substrate 1 are chemically etched to produce a mesa section.

Then, a p-type InP layer 5, a p-type InGaAsP layer 6 and a semi-insulating InP layer 7 are formed on the lateral sides of or around the mesa section in a second MOCVD process in such a manner that the lateral sides of the mesa section is covered by the p-type InP layer 5 whereas the p-type InGaAsP layer 6 and the semi-insulating InP layer 7 are sequentially formed around the mesa section.

Subsequently, when the $SiO_2$ mask is removed, an n-type InP layer 8 and an n-type InGaAsP layer 9 are sequentially formed on the upper surface of the prepared semiproduct to cover the nondoped InP layer 4 through the p-type InGaAsP layer 6 in a third MOCVD process.

Finally, an n-type electrode 10 is formed on the n-type InGaAsP layer 9 and, as a mesa is formed by chemical etching, using the electrode as a mask, the p-type InGaAsP layer 6 is exposed as a stop-etching layer on the lateral sides, p-type electrodes 11 are formed on the respective surfaces of the layer.

With a quantum well type semiconductor laser device prepared in an above described manner, electrons are injected sequentially into the upper optical confinement layer 34, the barrier layer 32 and the quantum well layer 33 though a channel passing through the n-type InGaAsP layer 9, the n-type InP layer 8, the nondoped InP layer 4, whereas holes are injected from the buried layer, or the p-type InP layer 9, on the lateral sides of the mesa section directly into the quantum well layer 33 without passing through the lower optical confinement layer 31, the upper optical confinement layer 34, the barrier layer 32 and other layers.

Figure 2:
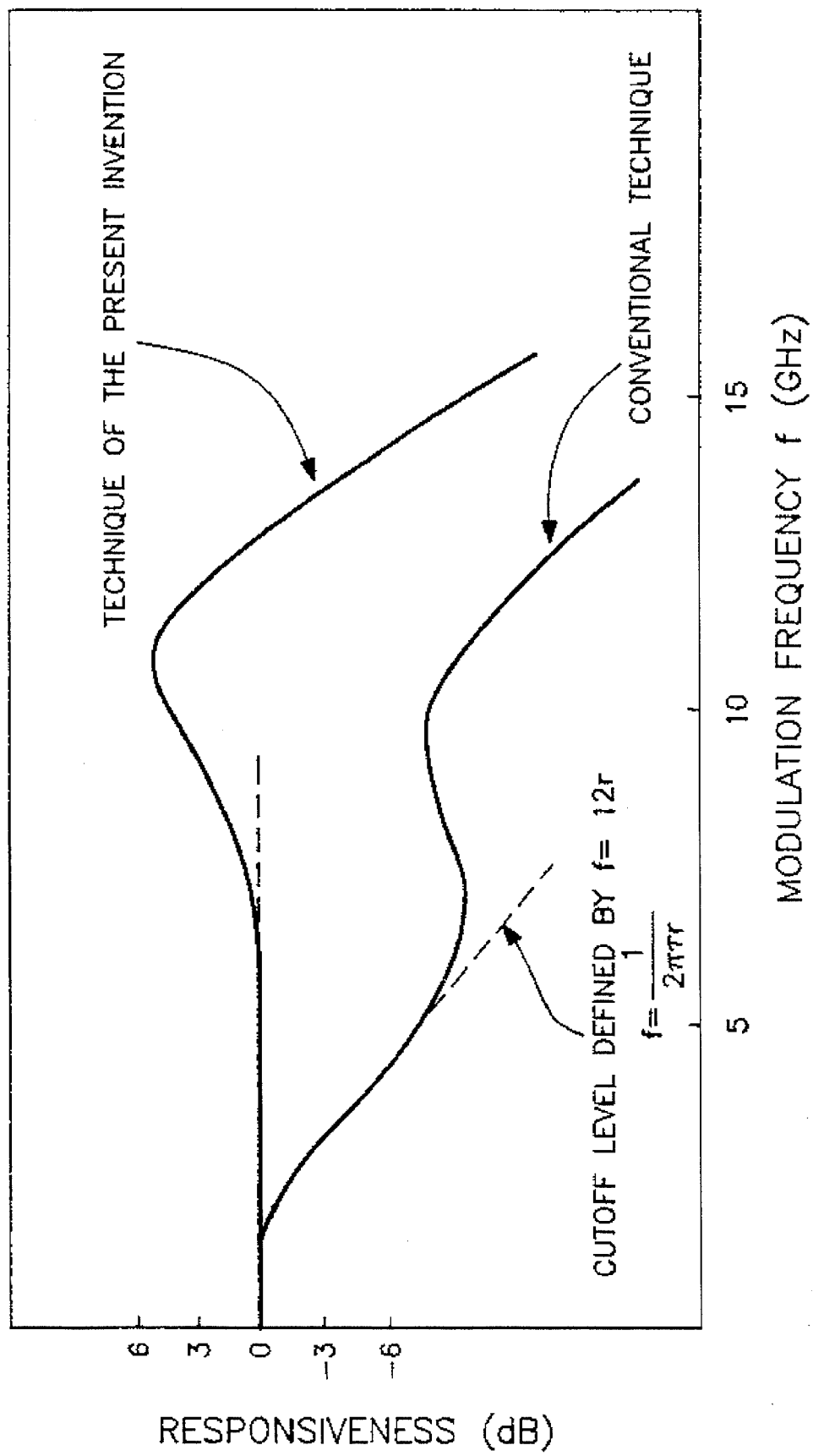
FIG. 2 is a graph showing the modulation response of a quantum well type semiconductor laser device according to the invention and obtained by a simulation.

FIG. 2 shows a graph showing the modulation response of a quantum well type semiconductor laser device according to the invention and obtained by a simulation along with those of a conventional device using a conventional modulation technique.

The value of $\tau_r$ is defined by the thickness of the optical confinement layers and the mobility of holes and assumed to be approximately 50 psec.

It will be obvious from FIG. 2 that the modulation response of of a conventional device shows a roll-off phenomenon that at the corner-frequency of $f_c=(2\pi\tau_r)^{-1}\cdot 3.2$ GHz, which considerably reduce the modulation speed.

This will be explained by the fact that, in a conventional device, electrons having a small effective mass and a long diffusion distance readily diffuse through the wide optical confinement layers and pass over the barrier layer, whereas holes having properties opposite to those of electrons take a long time to diffuse through the optical confinement layers and pass over the barrier layer.

Contrary to this and as described earlier, in a quantum well semiconductor laser device according to the present invention, since electrons are injected through the optical confinement layers and the barrier layer into the quantum well layer, while holes are injected directly into the quantum well layer without passing through the optical confinement layers and the barrier layer, the carrier density within the quantum well layer is directly modulated to improve the modulation response of the device.

Figure 3:
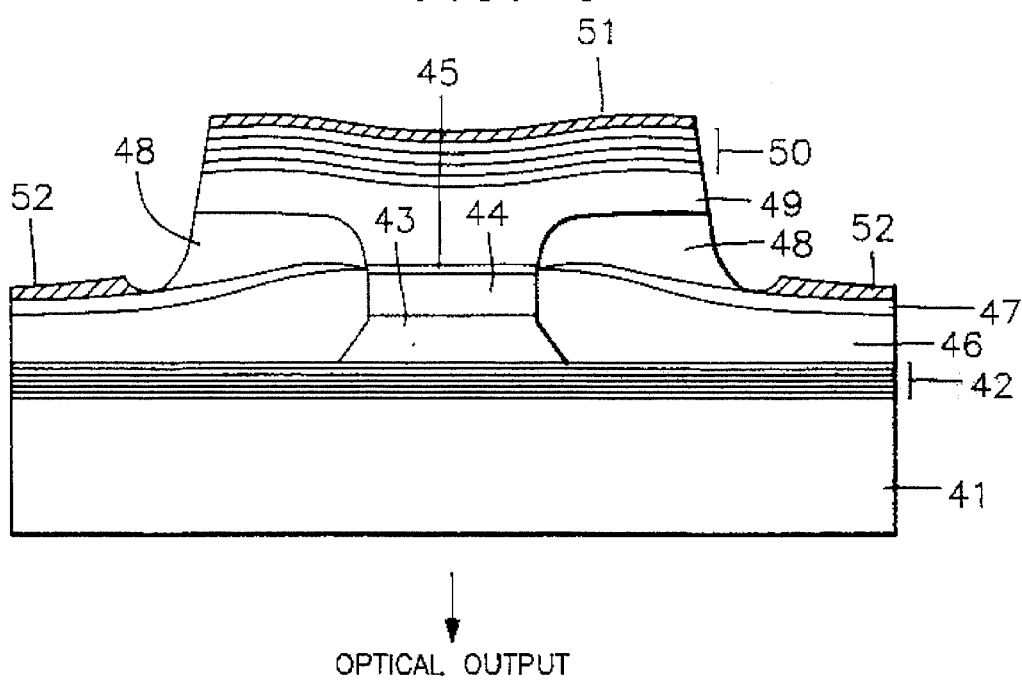
FIGS. 3 and 4 are respectively a cross-sectional view and a plane view of a second embodiment of semiconductor laser device of the invention, which is a surface emission type semiconductor laser device.
Figure 4:
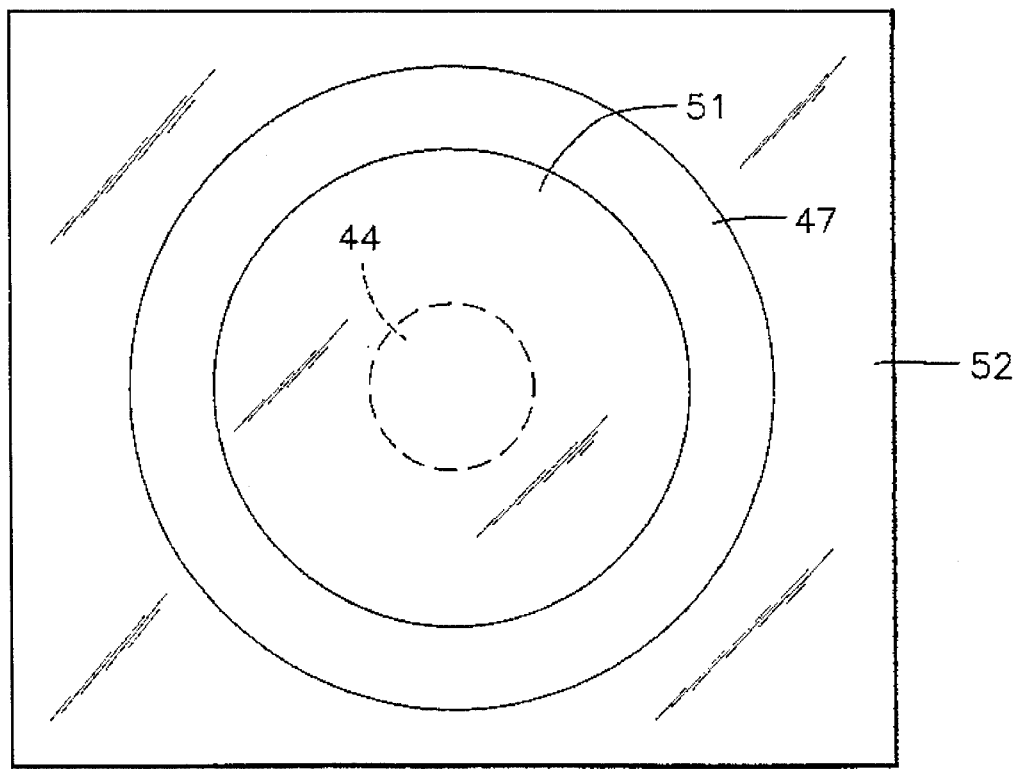

FIGS. 3 and 4 illustrates a second embodiment of the invention, which is a surface emission type semiconductor laser device.

Such a surface emission type semiconductor laser device may typically be prepared in a following manner.

To begin with, a semi-insulating multilayer film (multilayer reflection film) 42, a p-type doped InP lower clad layer 43, a nondoped InGaAsP active layer 44, a nondoped InP upper clad layer 45 are sequentially formed on a semiconductor InP semi-insulating substrate 1 by epitaxial growth in a first MOCVD process.

The above semi-insulating multilayer film 42 is formed by alternately arranging thirty 2,000 Å thick InGaAsP layers with a band gap wavelength $\lambda_g=1.4$ µm and thirty 2,000 Å thick InP layers with a band gap wavelength $\lambda_g=1.4$ µm.

The p-type doped InP lower clad layer 43 is 1 µm thick and doped with Zn to a concentration of approximately $5\times10^{17}$ cm$^{-3}$.

The nondoped InGaAsP active layer 44 is 0.6 µm thick and has a band gap wavelength $\lambda_g=1.5$ µm.

The nondoped upper clad layer 45 is 0.5 µm thick.

Then, an SiO$_2$ film is formed on the nondoped InP upper clad layer 45 by plasma CVD technique and processed by photolithography to show a circular form having a diameter of 4 µm so that it may be used as an etching-resist mask.

Thereafter, the areas not covered by the mask or the surrounding areas from the nondoped InP layer 45 down to the InP semi-insulating substrate 41 are chemically etched to produce a circular mesa section.

Then, a p-type InP surrounding lateral layer 46, a p-type InGaAsP contact layer 47 and a semi-insulating InP layer 48 for current confinement are formed on the upper surface and the lateral sides of or around the circular mesa section in a second MOCVD process using the SiO$_2$ film as a mask for selective growth in such a manner that the circular mesa section is covered by these layers.

The p-type InP surrounding lateral layer 46 is doped with Zn to a concentration of approximately $5\times10^{17}$ cm$^{-3}$.

The nondoped InGaAsP contact layer 47 is doped with Zn to a concentration of approximately $1\times10^{19}$ cm$^{-3}$ and has a band gap wavelength $\lambda_g=1.3$ µm.

The semi-insulating InP layer 48 is doped with Fe.

Subsequently, when the SiO$_2$ mask is removed, an n-type InP layer 49 and an n-type semi-insulating multilayer film (multilayer reflection film) 50 are sequentially formed on the upper surface of the prepared semiproduct to cover the nondoped InP layer 45 through the semi-insulating InP layer 48 in a third organometallic vapor deposition process.

The n-type InP layer 49 shows a carrier density of approximately $1\times10^{18}$ cm$^{-3}$.

The n-type semi-insulating multilayer film 50 has a structure substantially same as that of the semi-insulating film 42 except that it has a carrier density of approximately $1\times10^{18}$ cm$^{-3}$ and is doped to n-type.

Finally, an n-type electrode 91 is formed on the n-type semi-insulating multilayer film 50 and, as a circular mesa is formed by chemical etching, using the electrode as a mask, the p-type InGaAsP contact layers 47 is exposed as an etching prohibiting layer, p-type electrodes 52 are formed on the respective surfaces of the p-type InGaAsP contact layer.

With a surface emission type semiconductor laser device prepared in an above described manner, the electric current injected from the p-type electrodes 52 are introduced into the non-doped InGaAsP active layer 44 through its lower surface and the lateral sides by way of the p-type doped lower clad layer 43 and the p-type InP surrounding lateral clad layer 46 without passing through the semi-insulating multilayer film 42.

Consequently, the electric current is not only evenly injected into the active layer 44 but also does not lose the high-speed response of the device, because it is confined by the semi-insulating InP layer 48 in the device where the n-type electrode 51 and the p-type electrodes 52 are not oppositely arranged.

The optical output of an above described surface emission type semiconductor laser device is emitted along a direction indicated by an arrow in FIG. 3.

The hole injection path as disclosed above is applicable to any semiconductor laser devices other than the quantum well and the surface emission types having a configuration different from those of the embodiments provided that an n-type electrode and p-type electrodes are arranged on the upper surface of a semiconductor wafer.

The semiconductor substrate (semi-insulating substrate) of a semiconductor laser device according to the present invention is not limited to an InP substrate but any other known substrates including GaAs substrates may also appropriately be used.

The active layer to be used for the purpose of the present invention may be either of a single quantum well type or a multiple quantum well type and the optical confinement layers may have an SCH (Separate Confine Heterostructure) or GIN-SCH (Graded Index-Separate Confinement Heterostructure) structure.

The remaining layers of a semiconductor laser device according to the present invention may appropriately include III-V group p-type layers containing compound semiconductor alloys, n-type layers, doped layers, nondoped layer and any combinations of them.

The n-type and p-type electrodes to be used for the purpose of the present invention may be appropriately selected from those of any known types.

[Industrial Applicability]

Since a semiconductor laser device according to the invention comprises a lower optical confinement layer, an active layer and an upper optical confinement layer, said active layer being inserted between said upper and lower optical confinement layers and is characterized in that an electron injection path for injecting electrons into the active layer by way of the optical confinement layers and a hole injection path for injecting holes into the active layer without passing through the optical confinement layers are formed therein, evidently electrons are injected into the active layer by way of the optical confinement layers while holes are directly injected into the active layer without passing through the optical confinement layers to remarkably improve the modulation response and the modulation speed of the device.

A semiconductor laser device as disclosed by the present invention can be usefully and effectively used as a optical source for optical transmission in the field of optical telecommunications and optical instrumentation because of its high-speed modulation capability.

What is claimed is:

1. A semiconductor laser device comprising a lower optical confinement layer, an active layer and an upper optical confinement layer, said active layer being positioned between said upper and lower optical confinement layers, characterized in that an electron injection path for injecting electrons into the active layer by way of the optical confinement layers and a hole injection path for injecting holes directly into the active layer substantially without passing through the optical confinement layers are formed therein and an insulating layer is formed between said electron injection path and said hole injection path.

2. A semiconductor laser device according to claim 1, wherein the lower optical confinement layer, the active layer and the upper optical confinement layer are formed to a mesa section having an upper side covered by a n-type layer and lateral sides covered by an p-type layer.

3. A semiconductor laser device according to claim 2, wherein the active layer and the barrier layer are made of a quantum well layer.

4. A semiconductor laser device according to claim 3, wherein the bandgap of the quantum well layer is longer than the optical confinement layers.

5. A semiconductor laser device according to claim 2, wherein the lower and upper optical confinement layers are made of a single semiconductor layer.

6. A semiconductor laser device according to claim 2, wherein an n-electrode is arranged on the n-type layer covering the upper side of the mesa section and p-electrodes are arranged on the p-type layer covering lateral sides of the mesa section.

7. A semiconductor laser device according to claim 1, wherein a lower reflection film and an upper reflection film are provided under the upper sides of said active layer.

8. A semiconductor laser device according to claim 7, wherein the n-electrode is arranged on upper side of the upper optical confinement layer and the p-electrodes are arranged on the upper sides of the n-type layer covering the respective lateral sides of the mesa section.

9. A semiconductor laser device according to claim 7, wherein the lower reflection film is made of a non-doped multilayer film.

10. A semiconductor laser device according to claim 7, wherein the upper reflection film consists of an n-type semiconductor multilayer film.

* * * * *